United States Patent
Takahashi et al.

(10) Patent No.: US 6,821,657 B1
(45) Date of Patent: Nov. 23, 2004

(54) SOLVENT-FREE THERMOSETTING RESIN COMPOSITION, PROCESS FOR PRODUCING THE SAME, AND PRODUCT THEREFROM

(75) Inventors: Akio Takahashi, Hitachiota (JP); Yuichi Satsu, Hitachi (JP); Harukazu Nakai, Hitachi (JP); Masao Suzuki, Tsukuba (JP); Yuzo Ito, Mito (JP); Shuichi Oohara, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/182,181

(22) PCT Filed: Jan. 28, 2000

(86) PCT No.: PCT/JP00/00507

§ 371 (c)(1),
(2), (4) Date: Sep. 25, 2002

(87) PCT Pub. No.: WO01/55243

PCT Pub. Date: Aug. 2, 2001

(51) Int. Cl.$^7$ .......................... B32B 27/38; B32B 9/04; C08L 83/04; C08L 63/00
(52) U.S. Cl. ....................... 428/901; 428/414; 428/447; 428/448; 525/476; 525/27
(58) Field of Search ................................. 428/413, 414, 428/446, 447, 448, 901; 525/476; 528/27

(56) References Cited

U.S. PATENT DOCUMENTS 5,623,026 A * 4/1997 Buekers et al. ............. 525/463
6,100,313 A * 8/2000 Treadway ................... 522/170

FOREIGN PATENT DOCUMENTS

| JP | 5-291438 | 11/1993 |
| JP | 08-100107 | 4/1996 |
| JP | 08-199045 | 8/1996 |
| JP | 09-216938 | 8/1997 |
| JP | 09-291131 | 11/1997 |
| JP | 11-209579 | 8/1999 |

OTHER PUBLICATIONS

Hiroshi Kakiuchi, "New Epoxy Resin", Ch. 9, (1988) and English translation of the most relevant part.

* cited by examiner

Primary Examiner—Philip C. Tucker
Assistant Examiner—Michael J. Feely
(74) Attorney, Agent, or Firm—Antonelli, Terry, Stout & Kraus, LLP

(57) ABSTRACT

A solvent-free thermosetting resin composition which comprises an epoxy resin (a) and a product (b) of the reaction of an organosilicon compound, represented by the general formula (1) (where R is an organic group containing a functional group reactive with an epoxy resin by addition reaction; and R1 is a methyl or ethyl group), with water, the product (b) containing organosilicon compound polycondensates formed in the epoxy resin (a) and having a degree of polycondensation of 2 or higher, and which has a low viscosity at a room temperature (25° C.) and gives a cured resin having intact material properties, especially intact high-temperature mechanical properties; a process for producing the resin composition; and a product obtained by applying the composition.

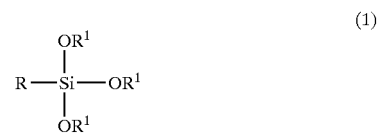

(1)

8 Claims, 3 Drawing Sheets

SOLVENT-FREE THERMOSETTING RESIN COMPOSITION, PROCESS FOR PRODUCING THE SAME, AND PRODUCT THEREFROM

BACKGROUND OF THE INVENTION

The present invention relates to the type of thermosetting resin composition that is used broadly in the field of electric and electronic appliances; and, more particularly, the invention relates to a solvent-free thermosetting resin composition, a process for producing the same, and a product thereof, that is required, from the viewpoint of workability, to be in a liquid form before curing.

The present invention relates to a liquid sealing material and paste bonding material for mounting semiconductors and to the conductive paste material that is used for connecting the layers of a printed wiring board, all of which are used broadly in the field of electronic appliances. The resins used for these materials are required to have a filling ability with a filler and metallic powder and an ability to impregnate into glass cloth.

The resin, after being cured, on the other hand, is required to have high-temperature mechanical properties, so that the resin can be used at a high temperature during the mounting of components or in operation. Conventionally, an epoxy resin composition, which is in a liquid form at room temperature (25° C.), has been used broadly in this field, and a reactive diluent, such as phenyl-glycidyl-ether, is added to lower the viscosity of the varnish. Besides, for a curing agent, a liquid acid-anhydride type is used to lower the viscosity of the varnish. However, when a low molecular-weight component, such as butyl-glycidyl-ether or phenyl-glycidyl-ether, is used as the diluent, the material properties of the cured resin, particularly those at a high temperature, tend to deteriorate ("New Epoxy Resin" written by Hiroshi Kakiuchi, Article 9, 1988).

When liquid acid-anhydride is used as the curing agent, the amount needed is the same as the epoxy, and its applications are limited in view of the material properties, curing ability and workability ("Higher Performance of Epoxy Resin, and Mixing Technique, Evaluation, and Application of Curing Agent: Section 3" written by Technical Information Association, 1997).

In addition, since an applicable epoxy resin is limited to a low molecular-weight alicyclic type epoxy resin, such as vinyl-cyclohexene-dioxide (25° C., 7 cps) or alicyclic epoxy-carbonate (25° C., 360 cps), restraints arise in the material properties in that an amine type curing agent cannot be used due to its reactivity, the cured resin is brittle, and so on.

For this reason, aromatic liquid epoxy resins of a bisphenol A or bisphenol F type or a phenol-novolak type, which have excellent mechanical properties, bonding ability and heat resistance after being cured, have been used. However, since these resins have high viscosity at around room temperature (25° C.), lower viscosity is attained by using both an alicyclic type epoxy resin and a reactive diluent, or by using a liquid acid-anhydride type curing agent at the sacrifice of the material properties of the cured resin.

On the other hand, as methods of improving the mechanical properties of the resin at a high temperature, the Japanese Application Patent Laid-Open Publication No. Hei 8-100107 (1996) discloses a polycondensation of the resin by adding metallic alkoxide to an epoxy resin; Japanese Application Patent Laid-Open Publication No. Hei 9-216938 (1997) discloses polycondensation of the resin after swelling a metallic alkoxide in a phenol resin; and Japanese Application Patent Laid-open Publication No. Hei 9-291131 (1997) discloses condensation of the resin by a sol-gel method after adding metallic alkoxide into a polyurethane resin. However, since the curing reaction involves polycondensation in these methods, there arises a problem in that water is generated during the reaction and blistering is caused on the interface of the compound material. Besides, in these prior methods, no consideration is given to the prevention of blistering and cracking caused on the interface of the compound material by a change in the temperature.

The Japanese Application Patent Laid-Open Publication No. Hei 8-199045 (1996) discloses a method where, in order to reduce the generation of thermal stress, alkoxyl silane and water are added to the epoxy resin dissolved in an organic solvent; and, after the alkoxyl group in alkoxyl silane is hydrolyzed, the solvent is removed, and then the resin is heated to cure it and to dehydrate and condensate the hydroxyl group. However, since water is generated in the curing process, this method leads to deficiencies, such as creation of a void.

It is indicated in Japanese Application Patent Laid-open Publication No. Hei 5-291438 (1993), which relates to a semiconductor device in which the semiconductor is sealed using an epoxy resin composition comprising epoxy resin, a curing agent and a reaction product of silane, that the resin composition increases the bonding ability of the semiconductor device with the frame and the silicon chip, and increases the moisture resistance and the reliability of the semiconductor device. This method, however, does not refer to the preliminary reaction of the silane compound in the epoxy resin, nor to the lowered viscosity of the resin.

It is indicated in Japanese Application Patent Laid-open Publication No. Hei 11-209579 (1999), which relates to an epoxy resin composition for sealing, comprising epoxy resin, a curing agent and a reaction product of silane, and containing a silane compound that contains a mercaptyl group, that the bonding ability of the resin composition can be improved when the silane compound containing a mercaptyl group is first hydrolyzed and then reacted with the epoxy resin. However, the mixture of the silane compound containing a mercaptyl group is 0.001 to 5 % by weight, and the invention does not refer to the realization of a lower viscosity by forming organosilicon compound polycondensates having a degree of polycondensation of 2 or higher.

Conventionally, to lower the viscosity of liquid thermosetting resins, there have been several methods using a reactive diluent, a liquid acid-anhydride type curing agent, or an alicyclic low molecular-weight resin. These methods, however, have caused a problem in that the material properties of the cured resin need to be sacrificed.

It is an object of the present invention to provide a solvent-free thermosetting resin composition which has a low viscosity and gives a cured resin having intact material properties, especially intact high-temperature mechanical properties, a process for producing the resin composition, and a product obtained by applying the composition.

SUMMARY OF THE INVENTION

In order to achieve the above object, it is required to provide a diluting component which has a lower viscosity than the thermosetting resin used as the base material; and, by using which, the high-temperature mechanical properties of the whole resin after being cured is equal to or better than those of the cured thermosetting resin itself, which is used as the base material.

The present invention relates to a liquid solvent-free thermosetting resin composition that is in a liquid form at room temperature (25° C.), comprising an epoxy resin and a product of the reaction of an organosilicon compound with water as a basis, and to a process for producing the resin composition. That is to say, the present invention proposes to heat a solution of epoxy resin mixed with a product of the hydrolysis of an organosilicon compound and water and to remove the water and alcohol, to be generated as a byproduct, by heating, so as to offer a thermosetting resin composition with a low viscosity that is in a liquid form at room temperature. After the above process, a curing agent is added and the resin composition is heated to obtained a cured resin. The cured resin exhibits high-temperature mechanical properties equal to or better than those obtained by adding the curing agent to the epoxy resin and heating it to cure it.

The above organosilicon compound and water, when heated in the epoxy resin (that is, in the presence of the epoxy (resin) react with each other and form a liquid oligomer. The liquid oligomer is very much compatible with the epoxy resin and functions as a reactive diluent. Thus, the viscosity of the thermosetting resin composition resulting from the above can be reduced tremendously, and lower thermal expansion or higher thermal conductivity can be added to the resin composition by adding a lot of inorganic filler, such as alumina and silica.

The resin composition of the present invention, suitable for the sealing and die bonding material of a semiconductor device, is capable of providing a highly reliable semiconductor device. Besides, the composition is excellent as a conductive paste, because a lot of metallic powders can be mixed, and applying the composition to the through-hole of a multi-layer printed wiring board makes it possible to improve the reliability of the connection. The present invention is also applicable to the insulation material used in a rotary machine and a transformer, in which material a solvent-free casting resin and an inorganic filler are mixed.

The above organosilicon compound in an oligomer form has a SiO2 skeleton that is stable in terms of the mechanical properties thereof, and has a functional group that reacts with a curing agent commonly used for the epoxy resin. For this reason, when the above thermosetting resin composition is heated to cure it, the organosilicon compound in an oligomer form and the epoxy resin react with each other through the aid of the curing agent, and a uniform cured resin is formed preferably at a level of size of 10 nanometer or less, or more preferably 3 nanometer or less. As a result, a cured resin with excellent high-temperature mechanical properties is obtained.

Besides, the cured resin of the resin composition of the present invention does not generate a void or a crack that leads to deficiencies because, in the heating process prior to adding the curing agent where the oligomer is generated, the water and alcohol to be generated as a byproduct have been removed.

A summary of the present invention is as follows:

[1] A solvent-free thermosetting resin composition which comprises an epoxy resin (a) and a product (b) of the reaction of an organosilicon compound, represented by the general formula (1)

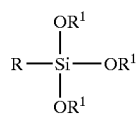
(1)

(where R is an organic group containing a functional group reactive with an epoxy resin by addition reaction; and R1 is a methyl or ethyl group), with water, the product (b) containing organosilicon compound polycondensates formed in the epoxy resin (a) and having a degree of polycondensation of 2 or higher, and which is in a liquid form at room temperature (25° C.).

[2] A solvent-free thermosetting resin composition which comprises an epoxy resin (a), the product (b) and a curing agent (c) as essential components, and which is in a liquid form at room temperature (25° C.).

[3] A process for producing a solvent-free thermosetting resin composition, which is in a liquid form at room temperature (25° C.), where, under the existence of an epoxy resin, an organosilicon compound represented by the general formula (1) and water are reacted with each other by heating at 60 to 160° C. for 1 to 10 hours, and then a curing agent (c) is added. In the above, it is preferred that the amount of water is 3 to 0.02 times the organosilicon compound by mole ratio.

[4] A semiconductor device in which, at least, part of the semiconductor is coated or sealed with a thermosetting resin material, where the thermosetting resin material comprises a solvent-free thermosetting resin composition, which comprises an epoxy resin (a), the product (b) and a curing agent (c) as essential components and which is in a liquid form at room temperature (25° C.), and an inorganic filler as essential components.

[5] A semiconductor device in which a semiconductor chip and a lead frame are bonded together using a die bonding material containing a thermosetting resin material, where the thermosetting resin material comprises a solvent-free thermosetting resin composition, which comprises an epoxy resin (a), the product (b) and a curing agent (c) as essential components and which is in a liquid form at room temperature (25° C.), and a metallic powder or inorganic filler as essential components.

[6] A semiconductor device in which the semiconductor and a wiring board are mounted using a thermosetting resin material, where the thermosetting resin material comprises a solvent-free thermosetting resin composition, which comprises an epoxy resin (a), the product (b) and a curing agent (c) as essential components and which is in a liquid form at room temperature (25° C.), and a conductive metallic powder as essential components.

[7] A printed wiring board which, at least, has two or more wiring layers, which layers are made conductive to each other using a conductive material containing a thermosetting resin material, where the conductive material comprises a solvent-free thermosetting resin composition, which comprises an epoxy resin (a), the product (b) and a curing agent (c) as essential components and which is in a liquid form at room temperature (25° C.), and a conductive metallic powder as essential components.

Since the thermosetting resin composition according to the present invention has a low viscosity before curing by heat, it is applicable to any thermosetting resin molding. Before a curing agent is added, a mixture of the epoxy resin, organosilicon compound and water are heated so as to remove the reaction byproducts, such as water and alcohol. For this reason, byproducts, such as water and alcohol, are rarely generated in the curing process; and, therefore, even when a compound material is produced together with a base material, such as a metal, ceramic or resin, neither blistering on the interface between the base material and the resin composition of the present invention, nor cracking and separation on a molding, are caused.

The process for producing the resin composition is characterized in that, under the existence of an epoxy resin, the afore-mentioned organosilicon compound and water are reacted with each other, and, more specifically, reacted by heating at 60 to 160° C. for 1 to 10 hours. In this reaction, it is preferred that the amount of water is 3 to 0.02 times the organosilicon compound by mole ratio.

In addition, the reaction product of the organosilicon compound and water has a SiO2 skeleton that is stable in terms of the mechanical properties, and it has a functional group that reacts with a curing agent commonly used for the epoxy resin. Since the heated and cured resin of the thermosetting resin composition of the present invention is highly heat-resistive and experiences little change in its modulus of elasticity at a high temperature because of the above, thermal stress and cracking hardly occur. Since a high modulus of elasticity can be maintained even at a high temperature, deformation of the thermosetting resin material by a load due to an external force can be controlled.

The present invention is able to lower the melt viscosity during heating of a thermosetting resin composition that is in a solid form at room temperature.

There is no particular limitation to the epoxy resin, and any well-known ones are applicable. For example, bisphenol A type epoxy resin, bisphenol F type epoxy resin, novolak type epoxy resin, glycidyl-diamine type epoxy resin, alicyclic type epoxy resin are applicable.

As the curing agent for the epoxy resin, general well-known chemicals that are used normally can be employed. There are available, for example, carboxylic acid anhydride, Class 1, Class 2 or Class 3 amine compound, Class 4 ammonium salt, dicyan-diamide, boron trifluoride-amine complex, organic acid hydrazide, imidazole compound, onium salt compound, a compound having phenol, cresol or xylenol as the basic skeleton as well as a derivative thereof and a polycondensate thereof, and Thiokol compound, out of which any can be selected for the purpose and application.

In addition, a well-known curing accelerator, mold releasing agent, coupling agent, coloring agent, plasticizer, diluent, flexibility adding agent, various rubber materials, and a photosensitive material can be added for the purpose and application.

An example of the organosilicon compound represented by the general formula (1) in accordance with the present invention includes the organosilicon compounds having a polyaddition type functional group expressed by the following chemical formulas (2) to (11).

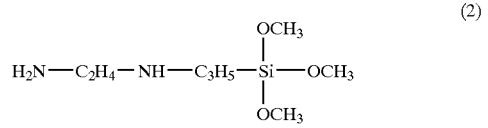

(2)

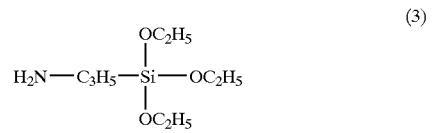

(3)

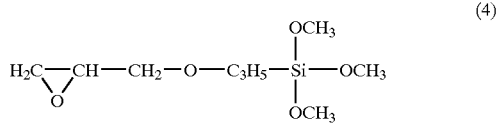

(4)

-continued

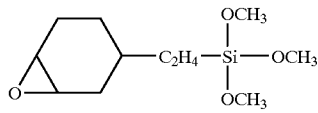

(5)

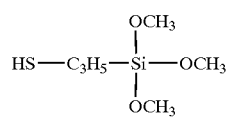

(6)

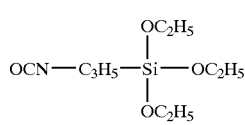

(7)

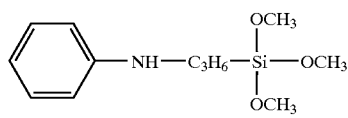

(8)

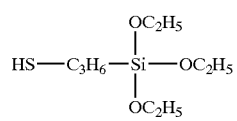

(9)

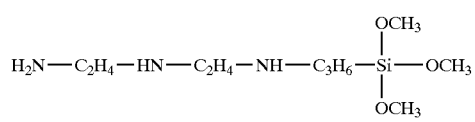

(10)

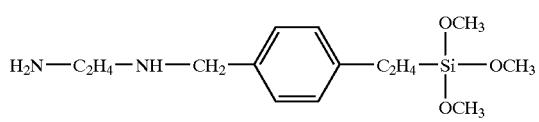

(11)

Figure 1:
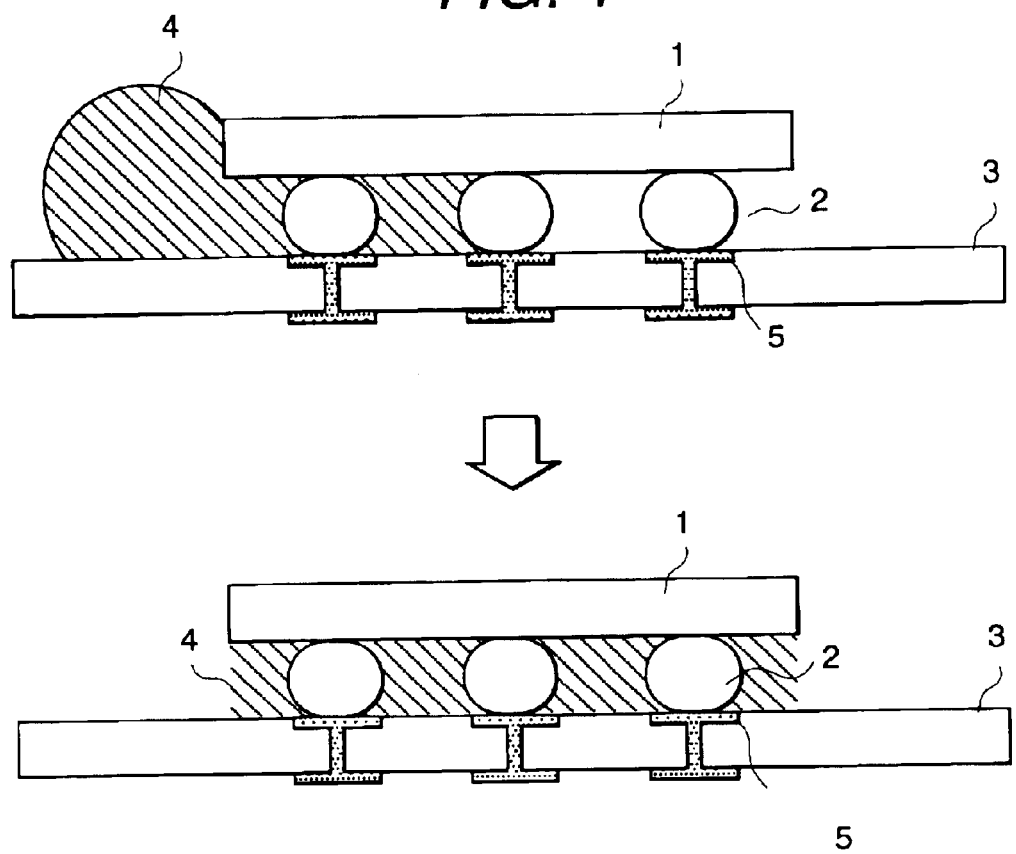
FIG. 1 is a diagram which shows how the thermosetting resin composition is filled into a gap between an electronic component and a wiring board.

DETAILED DESCRIPTION OF THE INVENTION (Description of the Preferred Embodiment)

The inventors of the present invention have found that preheating a mixture of an epoxy resin, and organosilicon compound and water prior to adding a curing agent is effective to obtain a thermosetting resin composition which has a low viscosity at a room temperature of around 25° C., and, in the curing process of which, generation of a byproduct, such as water and alcohol, is controlled to as extremely a low amount as possible. The organosilicon compound indicated above contains a functional group that is reactive with a curing agent of the epoxy resin by addition reaction.

As a result of the above heat treatment, an organosilicon compound having a high dispersibility and a molecular weight close to that of oligomer is formed. The organosilicon compound with a molecular weight close to that of oligomer is extremely compatible with the epoxy resin, and, hence, the thermosetting resin composition before curing has a low viscosity at room temperature (25° C.) and is transparent. In particular, a lot of inorganic filler, such as silica and alumina, can be mixed with the composition, and, even after being mixed, the composition can maintain an excellent fluidity at room temperature. For a similar reason, a lot of metallic powder can be mixed and the composition provides excellent fluidity as a conductive paste.

Because of the above, when the resin composition is applied as a liquid sealing material, die bonding material or conductive bonding material, a semiconductor device or printed wiring board with superior workability and, at the same time, high reliability can be provided.

[Embodiment 1]

3-glycidoxy-trymethoxy-silane (manufactured by Chisso Co., Ltd.) is used as an organosilicon compound, tin dibutyl-dilaurate (manufactured by Wako Pure Chemical Industry, Ltd.) is used as a hydrolytic catalyst, bisphenol F type epoxy resin EP4900E (manufactured by Asahi Denka Co., Ltd.) is used as an epoxy resin, and methaphenylene-diamine (manufactured by Wako Pure Chemical Industry, Ltd.) is used as a curing agent.

The process for producing the thermosetting resin composition will be explained hereunder.

(1) Each 2.0 g of water and tin dibutyl-dilaurate are added to 200 g of 3-glycidoxy-trymethoxy-silane and stirred together, and then the mixture is left to stand at room temperature for one day or longer.

(2) 180 g of epoxy resin EP-4900E is added to the mixture solution of step (1) and stirred together.

(3) The mixture solution of step (2) is subjected to a heat treatment at 140° C. for 4 hours.

(4) The viscosity of a liquid resin composition, obtained after being cooled down to room temperature, is 0.2 Pa.s at 25° C., and a tremendous reduction of the viscosity is recognized, as compared to 4 Pa.s for the epoxy resin EP4900E.

(5) The composition is heated to around 80° C. and 47 g of methaphenylene-diamine is added, and then they are stirred and dissolved together so as to obtain a thermosetting resin composition. The solution has a low viscosity and can be poured into a molding frame.

Next, the dynamic viscoelasticity of a resin plate will be explained hereunder. To obtain a resin plate, the solution of step (5) is heated at 80° C. and 200° C. for 4 hours each to cure. Byproducts, such as water and alcohol, are hardly generated through the curing process. A specimen for measuring the dynamic viscoelasticity is prepared from the resin plate. The measuring condition of the dynamic viscoelasticity, using a PVE rheo-spectrum meter (made by Rheology Co., Ltd.) is the temperature increasing speed: 2° C./minute, frequency: 10 Hz chuck distance, and displacement amplitude: 2 $\mu$m.

Table 1 shows the glass transition temperature (Tg) and the storage modulus at 50° C. and 220° C.

TABLE 1

| | Embodiment | | | | | |
|---|---|---|---|---|---|---|
| | 1 | 2 | 3 | 4 | 5 | 6 |
| Epoxy resin | 4900E 180 g | Epikote 828 190 g | DEN436 180 g | DER332 100 g | 4900E 100 g | HP-4032D, Epikote 828 100 g, 80 g |
| Curling agent | Methaphenylene-diamine 45 g | 2-ethyl-4-methyl-imidazole (2E4MZ) 14 g | Dicyan-diamide 13 g | MHAC-P 100 g | Phenol-novolak 100 g | 3-glycidoxy-trimethoxy-silane 41 g |
| Silane compound | 3-glycidoxy-tri-methoxy-silane 200 g | 3-glycidoxy-trimethoxy-silane 225 g | Epoxy-cycle-hexyl-ethyl-trimethoxy-silane 170 g | Epoxy-cyclehexyl-ethyl-trimethoxy-silane 170 g | 3-glycidoxy-trimethoxy-silane 200 g | 3-glycidoxy-trimethoxy-silane 200 g |
| Amount of tin dibutyl-dilaurate added | 2.0 g | 2.3 g | 1.7 g | 1.7 g | 2.0 g | 2.0 g |
| Amount of water added | 2.0 g | 2.3 g | 8.4 g | 3.4 g | 2.0 g | 4.0 g |
| Curling accelerator | — — | — — | BDMA 0.6 g | Curezol CN 1.2 g | 2E4MZ 3.0 g | — — |
| Heat treatment condition | 140° C.-4h | 150° C.-2h | 140° C.-4h | 150° C.-4h | 120° C.-2h | 120° C.-4h |
| Viscosity of varnish (25° C.) | 0.2 Pa · S | 0.5 Pa · S | 5 Pa · S | 0.4 Pa · S | 6 Pa · S | 1 Pa · S |
| Curling condition | 80° C.-4h 200° C.-4h | 80° C.-4h 180° C.-4h | 80° C.-2h 170° C.-2h | 80° C.-4h 180° C.-4h | 80° C.-4h 180° C.-4h | 80° C.-4h 180° C.-4h |
| Glass transition temperature | 190° C. | 175° C. | 165° C. | 160° C. | 185° C. | 170° C. |
| Storage elastic modulus (50° C.) | 2 GPa | 2 GPa | 2 GPa | 2 GPa | 2 GPa | 2 GPa |
| Storage elastic modulus (220° C.) | 0.7 GPa | 0.6 GPa | 0.7 GPa | 0.5 GPa | 0.6 GPa | 0.7 GPa |
| Bending strength (50° C.) | 120 MPa | 110 MPa | 110 MPa | 120 MPa | 110 MPa | 110 MPa |
| Bending strength (220° C.) | 52 MPa | 50 MPa | 55 MPa | 45 MPa | 50 MPa | 60 MPa |

TABLE 1-continued

| | Embodiment | | | | | |
|---|---|---|---|---|---|---|
| | 1 | 2 | 3 | 4 | 5 | 6 |
| Coefficient of thermal expansion (<Tg) | $7.3 \times 10^{-5}/k$ | $7.5 \times 10^{-5}/k$ | $7.2 \times 10^{-5}/k$ | $7.3 \times 10^{-5}/k$ | $7.2 \times 10^{-5}/k$ | $7.3 \times 10^{-5}/k$ |
| Coefficient of thermal expansion (>Tg) | $1.2 \times 10^{-4}/k$ | $1.2 \times 10^{-4}/k$ | $1.2 \times 10^{-4}/k$ | $1.4 \times 10^{-4}/k$ | $1.3 \times 10^{-4}/k$ | $1.1 \times 10^{-4}/k$ |

When the shelf elastic modulus and bending strength of the cured resin of this embodiment at 220° C., which is a temperature higher than Tg, are compared to those at room temperature, they are maintained at ⅓ or higher values, exhibiting the fact that the cured resin is thermally stable at a high temperature.

[Embodiment 2]

3-glycidoxy-trymethoxy-silane (manufactured by Chisso Co., Ltd.) is used as an organosilicon compound, bisphenol A type epoxy resin Epicoat EP 828 (manufactured by Yuka Shell Co., Ltd.) is used as an epoxy resin, and 2-ethyl-4-methyl-imidazole (manufactured by Shikoku Chemical Co., Ltd.) is used as a curing agent.

The process for producing the thermosetting resin composition will be explained hereunder.

(1) Each 2.3 g of water and tin dibutyl-dilaurate are added to 200 g of 3-glycidoxy-trymethoxy-silane and stirred together, and then the mixture is left to stand at room temperature for one day or longer.

(2) 190 g of epoxy resin Epicoat EP 828 is added to the mixture solution and stirred together.

(3) The mixture solution of step (2) is subjected to a heat treatment at 150° C. for 2 hours.

The viscosity of the thermosetting resin composition is 0.5 Pa.s at 25° C., which is a tremendous reduction, as compared to 14 Pa.s for the epoxy resin EP 828.

(4) 14 g of 2-ethyl-4-methyl-imidazole is added and stirred so as to obtain a thermosetting resin composition. The resin composition has a low viscosity and can be poured into a molding frame as it is.

Next, the dynamic viscoelasticity of a resin plate obtained from the resin composition of step (4) will be explained hereunder. To obtain a resin plate, the resin composition of step (4) is heated at 80° C. and 180° C. for 4 hours each to cure. Byproducts, such as water and alcohol are hardly generated through the curing process.

The dynamic viscoelasticity is measured in a similar manner as for the embodiment 1, using the resin plate.

Table 1 shows Tg and the shelf elastic modulus (50° C. and 220° C.).

When the shelf elastic modulus and bending strength of the cured resin of this embodiment at 220° C., which is a temperature higher than Tg, are compared to those at room temperature, they are maintained at ⅓ to ¼ values, exhibiting the fact that the cured resin is thermally stable at a high temperature.

[Embodiment 3]

2-(3, 4-epoxy-cyclohexyl)-ethyl-trymethoxy-silane (manufactured by Chisso Co., Ltd.) is used as an organosilicon compound, tin dibutyl-dilaurate (manufactured by Wako Pure Chemical Industry, Ltd.) is used as a hydrolytic catalyst, epoxy resin DEN 438 (manufactured by Dow Chemical Co., Ltd., epoxy equivalent 179) is used as an epoxy resin, dicyan-diamide (manufactured by Wako Pure Chemical Industry, Ltd.) is used as a curing agent, and further, benzyl-dimethyl-amine (manufactured by Wako Pure Chemical Industry, Ltd.).

The process for producing the thermosetting resin composition will be explained hereunder.

(1) 8.0 g of water and 1.7 g of tin dibutyl-dilaurate are added to 170 g of 2-(3,4-epoxy-cyclohexyl)-ethyl-trymethoxy-silane and stirred together, and then the mixture is left to stand at room temperature for one day or longer.

(2) 180 g of epoxy resin DEN 438 is added to the mixture solution of step (1) and stirred together.

(3) The mixture solution of step (2) is subjected to a heat treatment at 140° C. for 4 hours to obtain a solvent-free thermosetting resin composition. The viscosity of the resin composition is 5 Pa.s at 25° C., which is a reduction by one place of figure or more, as compared to 70 Pa.s for the epoxy resin DEN 438 at 25° C.

(4) The resin composition obtained in step (3) is heated to around 80° C., and then 13 g of dicyan-diamide and 0.6 g of benzyl-dimethyl-amine are mixed evenly so as to obtain a thermosetting resin composition. When this is poured into a mold frame and heated, a cured resin can be obtained.

Next, the dynamic viscoelasticity of a resin plate obtained from the solution of (4) will be explained hereunder.

To obtain a resin plate, the solution of step (4) is heated at 80° C. and 170° C. for 2 hours each to cure. Byproducts, such as water and alcohol, are hardly generated through the curing process. The dynamic viscoelasticity is measured in a similar manner as for the embodiment 1, using the resin plate.

Table 1 shows Tg and the shelf elastic modulus at 50° C. and 220° C.

When the shelf elastic modulus and bending strength of the cured resin obtained from the thermosetting resin material of this embodiment at 220° C., which is a temperature higher than Tg, are compared to those at a room temperature, they are maintained at ½ to ⅓ values, exhibiting the fact that the cured resin is thermally stable at a high temperature.

[Embodiment 4]

2-(3,4-epoxy-cyclohexyl)-ethyl-trymethoxy-silane (manufactured by Chisso Co., Ltd.) is used as an organosilicon compound, tin dibutyl-dilaurate (manufactured by Wako Pure Chemical Industry, Ltd.) is used as a hydrolytic catalyst, epoxy resin DER 332 (manufactured by Dow Chemical Co., Ltd., epoxy equivalent 179) is used as an epoxy resin, methyl-hymic acid anhydride MHACP (manufactured by Hitachi Chemical Co., Ltd.) is used as a curing agent, and imidazole type Curezol CN (manufactured by Shikoku Chemical Co., Ltd.) is used as a curing accelerator.

The process for producing the thermosetting resin composition of this embodiment will be explained hereunder.

(1) 3.4 g of water and 1.7 g of tin dibutyl-dilaurate are added to 170 g of 2-(3,4-epoxy-cyclohexyl)-ethyltrymethoxy-silane and stirred together, and then the mixture is left to stand at room temperature for one day or longer.

(2) 100 g of epoxy resin DER 332 is added to the mixture solution of step (1) and stirred together.

(3) The mixture solution of step (2) is subjected to a heat treatment at 150° C. for 4 hours.

(4) When the solution is cooled down to room temperature after the heat treatment, 100 g of methyl-hymic acid anhydride MHACP and 1.2 g of Curezol CN are added to obtain a solvent-free thermosetting resin composition in a liquid form. The viscosity of the resin composition is 0.4 Pa.s at 25° C., which is a tremendous reduction as compared to 0.9 Pa.s, the viscosity of a thermosetting resin composition, comprising 100 g of epoxy resin DER 332, 100 g of methyl-hymic acid anhydride MHACP and 1.2 g of Curezol CN, at 25° C. The solution can be poured into a mold frame as it is.

Next, the dynamic viscoelastcity of a resin plate obtained from the resin composition of step (4) will be explained hereunder. To obtain a resin plate, the solution is heated at 80° C. and 180° C. for 4 hours each to cure. Byproducts, such as water and alcohol, are hardly generated through the curing process. The dynamic viscoelasticity is measured in a similar manner as for the embodiment 1, using the resin plate.

Table 1 shows Tg and the shelf elastic modulus at 50° C. and 220° C.

When the shelf elastic modulus and bending strength of the cured resin of this embodiment at 220° C., which is a temperature higher than Tg, are compared to those at room temperature, they are maintained at $1/3$ to $1/4$ values, exhibiting that the cured resin is thermally stable at a high temperature.

[Embodiment 5]

3-glycidoxy-trymethoxy-silane (manufactured by Chisso Co., Ltd.) is used as an organosilicon compound, bisphenol F type epoxy resin EP-4900E (manufactured by Asahi Denka Co., Ltd.) is used as an epoxy resin, phenol-novolak resin (manufactured by Hitachi Chemical Co., Ltd.) is used as a curing agent, and 2-ethyl-4-methyl-imidazole (manufactured by Shikoku Chemical Co., Ltd.) is used as a curing catalyst.

The process for producing the thermosetting resin composition of this embodiment will be explained hereunder.

(1) Each 2.0 g of water and tin dibutyl-dilaurate are added to 200 g of 3-glycidoxy-trymethoxy-silane and stirred together, and then the mixture is left to stand at room temperature for one day or longer.

(2) 100 g of bisphenol F type epoxy resin EP-4900E is added to the mixture solution of step (1) and stirred together.

(3) The mixture solution of step (2) is subjected to a heat treatment at 100° C. for 2 hours.

(4) 100 g of phenol-novolak resin is added as a curing agent, and the solution is cooled down to room temperature to obtain a solvent-free thermosetting resin composition of the present invention that is in a liquid form at 25° C. The viscosity of the resin composition is 6 Pa.s at 25° C.

The viscosity of a resin composition obtained from a mixture of 100 g of bisphenol F type epoxy resin EP-4900E and 50 g of phenol-novolak resin, which is first stirred at 100° C. to heat and mix together and is then cooled down to 25° C., is 30 Pa.s.

(5) 3 g of 2-ethyl-4methyl-imidazole is added to the resin composition obtained in step (4), and this is stirred together to obtain a thermosetting resin composition. The resin composition has a low viscosity and can be poured into a molding frame as it is.

Next, the dynamic viscoelasticity of a resin plate obtained from step (5) will be explained hereunder. To obtain a resin plate, the resin composition of step (5) is heated at 80° C. and 180° C. for 4 hours each to cure. Byproducts, such as water and alcohol, are hardly generated through the curing process.

The dynamic viscoelasticity is measured in a similar manner as for the embodiment 1, using the resin plate. Table 1 shows Tg and the shelf elastic modulus at 50° C. and 220° C.

When the shelf elastic modulus and bending strength of the cured resin of this embodiment at 220° C., which is a temperature higher than Tg, are compared to those at a room temperature, they are maintained at around $1/3$ values, exhibiting the fact that the cured resin is thermally stable at a high temperature.

[Embodiment 6]

3-glycidoxy-trymethoxy-silane (manufactured by Chisso Co., Ltd.) is used as an organosilicon compound, naphthalene type epoxy resin EPICLON 4032 (manufactured by Dai-Nippon Ink Co., Ltd.) and bisphenol A type epoxy resin Epicoat EP 828 (manufactured by Yuka Shell Co.; Ltd.) are used as an epoxy resin, and methaphenylene-diamine (manufactured by Wako Pure Chemical Industry, Ltd.) is used as a curing agent.

The process for producing the thermosetting resin composition of this embodiment will be explained hereunder.

(1) 4 g of water and 2 g of tin dibutyl-dilaurate are added to 200 g of 3-glycidoxy-trymethoxy-silane and stirred together, and then the mixture is left to stand at room temperature for one day or longer.

(2) 80 g of epoxy resin EPICLON 4032 and 100 g of epoxy resin Epicoat EP 828 are added to the mixture solution of step (1) and stirred together.

(3) The mixture solution of step (2) is subjected to a heat treatment at 120° C. for 4 hours. The viscosity of the thermosetting resin composition of this embodiment, obtained after being cooled down to room temperature, is 0.5 Pa.s at 25° C., where a tremendous reduction is recognized, as compared to 16 Pa.s, the viscosity of an epoxy resin uniform mixture comprising 80 g of EPICLON 4032 and 100 g of Epicoat EP 828 at 25° C.

(4) The solution is heated to 80° C. and 41 g of methaphenylene-diamine is added, and then they are stirred and dissolved together so as to obtain a thermosetting resin composition. The resin composition, which is in a liquid form at room temperature, has a low viscosity, and it can be poured into a molding frame as it is.

Next, the dynamic viscoelasticity of a resin plate obtained from step (4) will be explained hereunder. To obtain a resin plate, the resin composition of step (4) is heated at 80° C. and 180° C. for 4 hours each to cure. Byproducts, such as water and alcohol, are hardly generated through the curing process. The dynamic viscoelasticity is measured in a similar manner as for the embodiment 1, using the resin plate.

Table 1 shows Tg and the shelf elastic modulus at 50° C. and 220° C.

When the shelf elastic modulus and bending strength of the cured resin of this embodiment at 220°, which is a temperature higher than Tg, are compared to those at room temperature, they are maintained at $1/2$ to $1/3$ values, exhibiting the fact that cured resin is thermally stable at a high temperature.

The thermosetting resin composition of the above embodiments 1 to 6 is solvent-free and in a liquid form, and its viscosity before being cured is as extremely low as 0.2 to 0.6 Pa.s. For this reason, it can be used as material for casting, as a paste material mixed with filler, a material for a composite, and as a liquid sealing material.

Besides, since the cured resin of the embodiments 1 to 6 is highly heat-resistive and causes little change in the modulus of elasticity between a room temperature and a high temperature, thermal stress is hardly caused and cracking is rarely caused on a molding. Furthermore, since byproducts, such as water and alcohol, are rarely generated in the curing process, even when a compound material is produced together with a base material, such as a metal, ceramic or resin, neither is blistering caused on the interface between the base material and the resin, nor is cracking and separation caused on a molding.

In other words, there have been several methods for improving the workability of a liquid thermosetting resin, including a method that employs a reactive diluent, a method that employs an alicyclic epoxy resin, or a method that employs a liquid and low-viscosity anhydride type curing agent, but every one involves a problem in that the material properties of the cured resin are affected or the application of the method is limited. Further, heating is a method for lowering the viscosity so as to improve the workability, but it involves a problem in that the energy efficiency is low and the usable life of the resin is shortened.

(Effects of the Invention)

The above embodiments have proved that, according to the present invention, the material properties of the resin composition after being cured are no longer injured, but rather are improved, and, at the same time, the viscosity before being cured can be lowered.

cured resins were compared and evaluated. The amounts of the curing agent and curing accelerator mixed were varied, as required for examination purposes, depending upon the epoxy equivalent of the epoxy resin.

Table 2 shows the evaluation result of the resin composition and material properties of the comparison samples. For each of the comparison samples 1, 2, 3 and 6, the viscosity of the epoxy resin component only was measured at 25° C. as the varnish viscosity. For the comparison sample 4, the viscosity of a resin composition, comprising the epoxy component, curing agent and curing accelerator, was measured at 25° C. as the varnish viscosity. For the comparison sample 5, the viscosity of a resin composition of an epoxy resin 4900E, in which phenol-novolak was dissolved, was measured. When a resin plate was molded from each resin composition, each resin composition was heated to 50 to 80° C., except for that of the comparison sample 4, so as to lower the viscosity and then it was poured into a mold and cured. For the comparison sample 4, since its viscosity is about two times the embodiment 4, heating is also necessary to lower the viscosity when it is soaked into a coil having a complicated shape.

As clearly seen from the comparison samples in Table 2, in the resin compositions of the embodiments 1 to 6, the viscosity is tremendously lowered at room temperature (25° C.), and yet the high-temperature material properties of the cured resin that are heated and cured in the same condition are far more excellent. This means that, when the level of the viscosity as a high-temperature material property is required to be similar to that of the comparison sample, much lower viscosity is available.

TABLE 2

|  | Comparison sample | | | | | |
| --- | --- | --- | --- | --- | --- | --- |
|  | 1 | 2 | 3 | 4 | 5 | 6 |
| Epoxy resin | 4900E 180 g | Epikote 828 190 g | DEN438 180 g | DER332 100 g | 4900E 100 g | HP-4032D, Epikote 828 100 g, 80 g |
| Curling agent | Methaphenylene-diamine 22 g | 2-ethyl-4-methyl-imidazole (2E4MZ) 6 g | Dicyan-diamide 6 g | MHAC-P 47 g | Phenol-novolak 63 g | |
| Curling accelerator | — | — | BDMA 0.3 g | Curezol CN 0.6 g | 2E4MZ 0.8 g | — |
| Viscosity of varnish (25° C.) | 4 Pa · S | 14 Pa · S | 70 Pa · S | 0.9 Pa · S | 30 Pa · S | 16 Pa · S |
| Curling condition | 80° C.-4h 200° C.-4h | 80° C.-4h 180° C.-4h | 80° C.-2h 170° C.-2h | 80° C.-4h 180° C.-4h | 80° C.-4h 180° C.-4h | 80° C.-4h 180° C.-4h |
| Glass transition temperature | 180° C. | 170° C. | 160° C. | 160° C. | 155° C. | 165° C. |
| Storage modulus (50° C.) | 2 GPa | 2 GPa | 2 GPa | 2 GPa | 2 GPa | 2 GPa |
| Storage modulus (220° C.) | 0.08 GPa | 0.04 GPa | 0.08 GPa | 0.05 GPa | 0.07 GPa | 0.06 GPa |
| Bending strength (50° C.) | 120 MPa | 110 MPa | 110 MPa | 120 MPa | 110 MPa | 110 MPa |
| Bending strength (220° C.) | 4 MPa | 3 MPa | 6 MPa | 4 MPa | 5 MPa | 4 MPa |
| Coefficient of thermal expansion (<Tg) | $6.7 \times 10^{-5}$k | $7.0 \times 10^{-5}$k | $6.9 \times 10^{-5}$k | $7.1 \times 10^{-5}$k | $7.0 \times 10^{-5}$k | $7.1 \times 10^{-5}$k |
| Coefficient of thermal expansion (>Tg) | $1.7 \times 10^{-4}$k | $2.0 \times 10^{-4}$k | $1.8 \times 10^{-4}$k | $2.2 \times 10^{-4}$k | $1.9 \times 10^{-4}$k | $1.1 \times 10^{-4}$k |

The effects of the present invention will be explained hereunder, using comparison samples.

[Comparison Samples 1 to 6]

Comparison samples were prepared, using the same epoxy resin, curing agent and curing accelerator as those of the embodiments 1 to 6, and the material properties of the

[Embodiments 7 to 11]

Table 3 shows the embodiments 7 to 11 of the present invention. The embodiments 7 to 11 are the resin composition that is prepared in the same process as the embodiment 2 shown in Table 1, and their curing condition after that is the same.

TABLE 3

| | Embodiment | | | | |
|---|---|---|---|---|---|
| | 7 | 8 | 9 | 10 | 11 |
| Epoxy resin | Epikote 828 190 g | Epikote 828 190 g | Epikote 828 190 g | Epikote 828 190 g | Epikote 828 190 g |
| Curling agent | 2-ethyl-4-methyl imidazole 14 g | 2-ethyl-4-methyl imidazole 14 g | 2-ethyl-4-methyl imidazole 14 g | 2-ethyl-4-methyl imidazole 14 g | 2-ethyl-4-methyl imidazole 14 g |
| Silane compound | 3-glycidoxy-trimethoxy-silane 225 g | 3-glycidoxy-trimethoxy-silane 225 g | Epoxy-cyclohexyl-ethyl trimethoxy-silane 225 g | Epoxy-cyclohexyl-ethyl trimethoxy-silane 225 g | 3-glycidoxy-trimethoxy-silane 225 g |
| Amount of tin dibutyl-dilaurate added | 2.3 g | 2.3 g | 2.3 g | 2.3 g | 2.3 g |
| Amount of water added | 2.3 g | 2.3 g | 1.5 g | 1.5 g | 23.0 g |
| Heat treatment condition | 60° C.-10h | 100° C.-4h | 120° C.-4h | 160° C.-2h | 100° C.-4h |
| Viscosity of varnish (25° C.) | 0.05 Pa · S | 0.1 Pa · S | 0.04 Pa · S | 0.2 Pa · S | 2.2 Pa · S |
| Curling condition | 80° C.-4h 180° C.-4h | 80° C.-4h 180° C.-4h | 80° C.-2h 180° C.-2h | 80° C.-4h 180° C.-4h | 80° C.-4h 180° C.-4h |
| Glass transition temperature | 170° C. | 170° C. | 170° C. | 175° C. | 165° C. |
| Storage elastic modulus (50° C.) | 1.8 GPa | 2 GPa | 1.9 GPa | 2 GPa | 2 GPa |
| Storage elastic modulus (220° C.) | 0.2 GPa | 0.3 GPa | 0.1 GPa | 0.3 GPa | 0.8 GPa |
| Bending strength (50° C.) | 120 MPa | 110 MPa | 110 MPa | 120 MPa | 110 MPa |
| Bending strength (220° C.) | 10 MPa | 15 MPa | 8 MPa | 20 MPa | 50 MPa |
| Coefficient of thermal expansion (<Tg) | $7.7 \times 10^{-5}$/k | $7.5 \times 10^{-5}$/k | $7.6 \times 10^{-5}$/k | $7.5 \times 10^{-5}$/k | $7.3 \times 10^{-5}$/k |
| Coefficient of thermal expansion (>Tg) | $1.8 \times 10^{-4}$/k | $1.6 \times 10^{-4}$/k | $1.9 \times 10^{-4}$/k | $1.4 \times 10^{-4}$/k | $1.1 \times 10^{-4}$/k |

The viscosity at room temperature (25° C.) can be lowered tremendously by softening the heat treatment condition of the varnish, as seen from the embodiments 7 and 8, and it can be further lowered by reducing the amount of water added, as seen from the embodiments 9 and 10. When this is done, the high-temperature material properties, such as the modulus of elasticity and the bending strength become lower than in the embodiment 2, but the resin composition still maintains sufficient high-temperature material properties, as compared to the comparison sample 2.

In the embodiment 11, where the amount of water added is increased up to 10 times, the viscosity at room temperature (25° C.) is 2.2 Pa.s, which is higher than in the embodiment 2, but is still as sufficiently low as about ⅕ of the comparison sample 2. The embodiment, on the contrary, exhibits better results in terms of the modulus of elasticity and the bending strength at a high temperature than the embodiment 2. That is, the solvent-free thermosetting resin composition of the present invention can be utilized properly for different material property requirements.

[Embodiment 12]

A silicon chip of 10 mm square is used, on which solder electrodes of 80 μm in diameter are arranged as electrodes at a center-to-center distance of 160 μm. Besides, a two-layered glass epoxy substrate is used as the wiring board.

After a bare chip 1 and solder bump electrodes 2 are positioned on the lands 5 of a wiring board 3, as shown in FIG. 1, and are soldered by infrared ray reflowing, the thermosetting resin 4 prepared in the following process is injected into a gap of about 50 μm between the electronic components and the wiring board 3. The gap is filled with the resin by the penetration method with the aid of the capillarity for a duration of 30 minutes, where the wiring board 3 is heated and maintained at 60° C. and then the thermosetting resin composition 4 is applied onto one side of the bare chip 1, using a dispenser. Then, the resin is heated to cure it at 80° C. and 180° C. for 4 hours each, so as to obtain the semiconductor device.

47 g of the resin composition prepared in the same process as for the embodiment 2 was used as the thermosetting resin composition, and spherical silica having an average particle size of 4 μm was added by 70% by weight and mixed together. Since the resin composition of the embodiment 2 has as low a viscosity as 0.5 Pa.s at room temperature (25° C.), it maintains sufficient fluidity even after spherical silica is added by 70% by weight. Thus, the resin composition is capable of sealing the device without causing any deficiency, such as voids and cracking.

A temperature cycle test, one cycle being −50° C. for 10 minutes and 150° C. for 10 minutes, was conducted and internal cracking in the solder and the thermosetting resin material was checked at every 50 cycles using an ultrasonic flaw detector. Five semiconductor devices were subjected to the temperature cycle test, but no internal cracking appeared in the solder and the thermosetting resin material even after 3000 cycles or more. The result shows that the reliability through the temperature cycle test is very high.

[Comparison Sample 7]

Five semiconductor devices were produced in the same way as in the embodiment 12 except that the thermosetting resin composition of the comparison sample 2 was employed. However, since the viscosity of the thermosetting resin of the comparison sample 2 is as high as 14 Pa.s at room temperature (25° C.), it needs to be heated to 80° C. when spherical silica is mixed. Furthermore, the penetration process for sealing is carried out also at 80° C.

As a result of the temperature cycle test in the same condition as in the embodiment 12, cracking appeared in the soldered portions on all semiconductor devices at 2000 cycles. In addition, cracking resulting from voids was caused in the resin portion on three samples.

The embodiment 12 and comparison sample 7 show that a semiconductor device with a very much more reliable sealing structure can be obtained according to the present invention. This is because the thermosetting resin composition has a low viscosity, and so spherical silica can be mixed smoothly and yet the mixing process can be carried out at room temperature (25° C.). As a result, a semiconductor device having a void-free uniform sealing structure can be provided. Besides, since the cured resin has superior high-temperature material properties, highly reliable semiconductor device can be realized.

[Embodiment 13]

Figure 2:
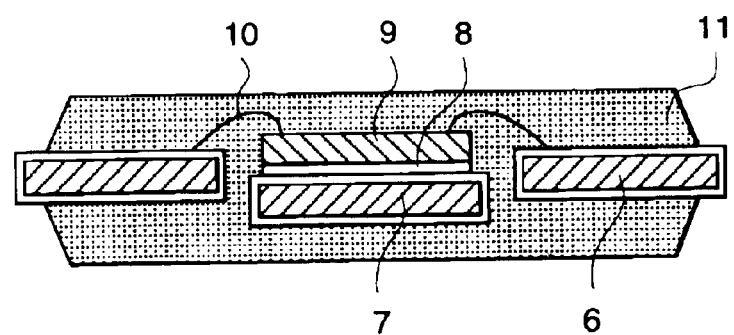
FIG. 2 is a cross sectional view of a semiconductor device that has been sealed withal resin.

A semiconductor device is produced as follows: after a semiconductor chip 9 and a lead frame die pad 7 are bonded together with a bonding material 8, they are connected to the leads 6 with thin metallic wires 10, and then the whole assembly is sealed with a resin 11, which process will be explained hereunder with reference to FIG. 2.

100 parts by weight of flake silver powder having a particle size of 10 μm or less and 100 parts by weight of the liquid thermosetting resin composition of the embodiment 3 were kneaded in a three-roll mill for 50 minutes to produce a paste bonding material.

About 100 mg of the paste bonding material was applied onto the die pad of a copper lead frame, using a dispenser. Then, with a compressive load of 500 g, a chip of 10 mm square was pressed to fit for 5 seconds at 250° C., and the chip was checked for warp. The peel-off strength when heated at 250° C. for 20 seconds was also measured. The warp of the chip was measured, using a surface roughness gauge, in terms of the maximum height (μm) from the baseline when the surface was scanned in a linear length of 10 mm.

A temperature cycle test, one cycle being −50° C. for 10 minutes and 150° C. for 10 minutes, was conducted and internal cracking in the bonding material and peeling were checked at every 50 cycles using an ultrasonic flaw detector. Five semiconductor devices were subjected to the temperature cycle test, but no internal cracking appeared in the bonding material even after 2000 cycles or more. The result shows that the reliability through the temperature cycle test is very high.

Initial value

Warp of chip: 5 μm, bonding strength of chip: 1.8 kg/mm$^2$

After 2000 cycles of the temperature cycle test

Warp of chip: 3 μm, bonding strength of chip: 1.6 kg/mm$^2$

[Comparison Sample 8]

An attempt was made to prepare a paste bonding material using 100 parts by weight of flake silver powder having a particle size of 10 μm or less and 100 parts by weight of the thermosetting resin composition of the comparison sample 3, which corresponds to the embodiment 3, but this ended in failure because the viscosity of the resin was 70 Pa.s and too high.

[Embodiment 14]

Figure 3:
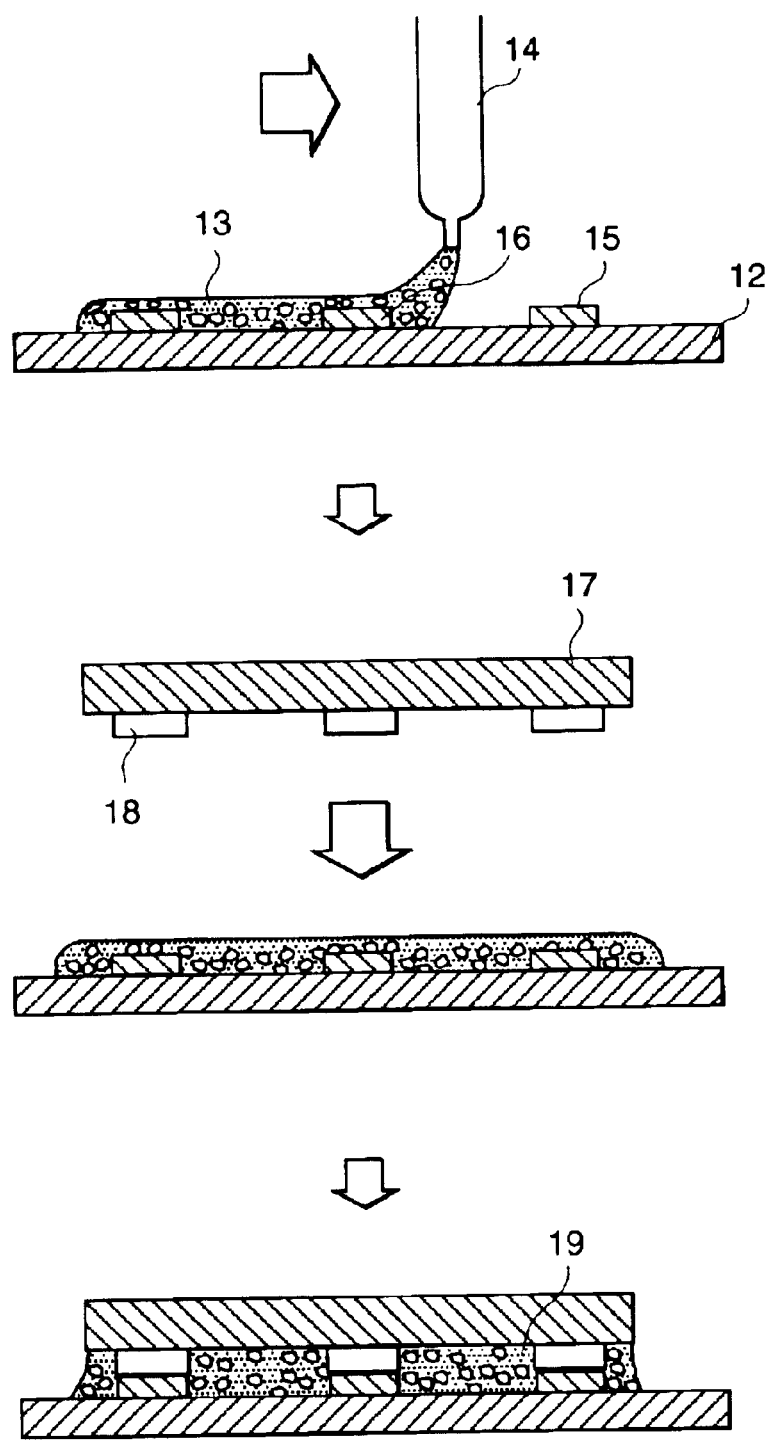
FIG. 3 is a process flow diagram showing a process of producing a semiconductor device to which a conductive bonding material is applied.

A process for producing a semiconductor device that employs a conductive bonding material will be explained hereunder with reference to FIG. 3.

A paste bonding material 13 containing nickel particles 16 was applied at a thickness of about 50 μm between a LSI chip and a wiring board (FR-5) 12 on which there were electrodes 15 made of copper/nickel/gold at a thickness of 20 μm, using a syringe 14. Then, while being heated at 200° C. and compressed at 30 kg/mm$^2$, the LSI chip 17 equipped with gold bumps 18 having a thickness of 20 μm was bonded and fixed for 20 seconds onto the wiring board. The product is then heated at 180° C. for 60 minutes in an oven to cure the bonding material (cured bonding material 19). For the above, a conductive chip of about 10 mm square, equipped with 184 bumps of 80 μm in diameter, was used.

100 parts by weight of nickel powder having an average particle size of 5 μm and 45 parts by weight of the liquid thermosetting resin composition of the embodiment 1 were mixed together and kneaded in a three-roll mill for 50 minutes to produce the paste bonding material.

A temperature cycle test, one cycle being −50° C. for 10 minutes and 150° C. for 10 minutes, was conducted and internal cracking in the bonding material and peeling were checked at every 50 cycles using an ultrasonic flaw detector. Five semiconductor devices were subjected to the temperature cycle test, but no internal cracking appeared in the bonding material, and the initial contact resistance of 1 mmΩ or less was maintained even after 1000 cycles or more. The result shows that the reliability through the temperature cycle test is very high. Note that the initial value is the value measured after 96 hours at 121° C. under 3 atm.

Initial value

Bonding strength between chip and board: 3.3 kg/mm$^2$

After 1000 cycles of the temperature cycle test

Bonding strength between chip and board: 2.8 kg/mm$^2$

[Comparison Sample 9]

Using the thermosetting resin composition of the embodiment 1, an attempt was made to produce a semiconductor device in the same way as in the embodiment 14. However, since the viscosity of the resin is as high as 4 Pa.s, it was heated to 70° C. when kneaded with nickel power. For the same reason, it was heated to 70° C. when applied by a syringe.

A temperature cycle test, one cycle being −50° C. for 10 minutes and 150° C. for 10 minutes, was conducted and internal cracking in the bonding material and peeling were checked at every 50 cycles using an ultrasonic flaw detector. Five semiconductor devices were subjected to the temperature cycle test; and, the result showed that cracking and peeling were caused on three samples after 500 cycles and that cracking and peeling were recognized on all five samples after 1000 cycles. The contact resistance was as high as 1Ω or more, as compared to the initial value of 1 mmΩ or less. Note that the initial value is the value measured after 96 hours at 121° C. under 3 atm.

Initial value

Bonding strength between chip and board: 2.0 kg/mm$^2$

After 1000 cycles of the temperature cycle test

Bonding strength between chip and board: 0.5 kg/mm$^2$

The embodiment 14 and comparison sample 9 show that a semiconductor device with highly reliable connection and excellent bonding between the chip and board can be obtained according to the present invention. This is because the liquid thermosetting resin composition has a low viscosity, and so the paste bonding material produced from it also has a low viscosity and, therefore, allows excellent workability. While the material in the comparison sample 9 is heated to 70° C. when mixed and applied, the resin composition can be handled at room temperature (25° C.), and so a void-free uniform bonding layer can be formed. Besides, the cured resin has superior high-temperature material properties. As a result, a highly reliable semiconductor device is obtained.

[Embodiment 15]

100 parts by weight of flake copper powder having an average particle size of 10 μm and 25 parts by weight of the liquid thermosetting resin composition of the embodiment 9 were mixed and kneaded in a three-roll mill for 50 minutes to produce a paste bonding material. Since the viscosity of the thermosetting resin composition is as low as 0.04 Pa.s at room temperature (25° C.), a conductive bonding material in a paste form with excellent fluidity can be obtained. The material was applied by screen-printing and heated at 170° C. for 60 minutes, and the specific resistance was measured. The result was $3 \times 10^{-5}$ Ω/cm.

Figure 4:
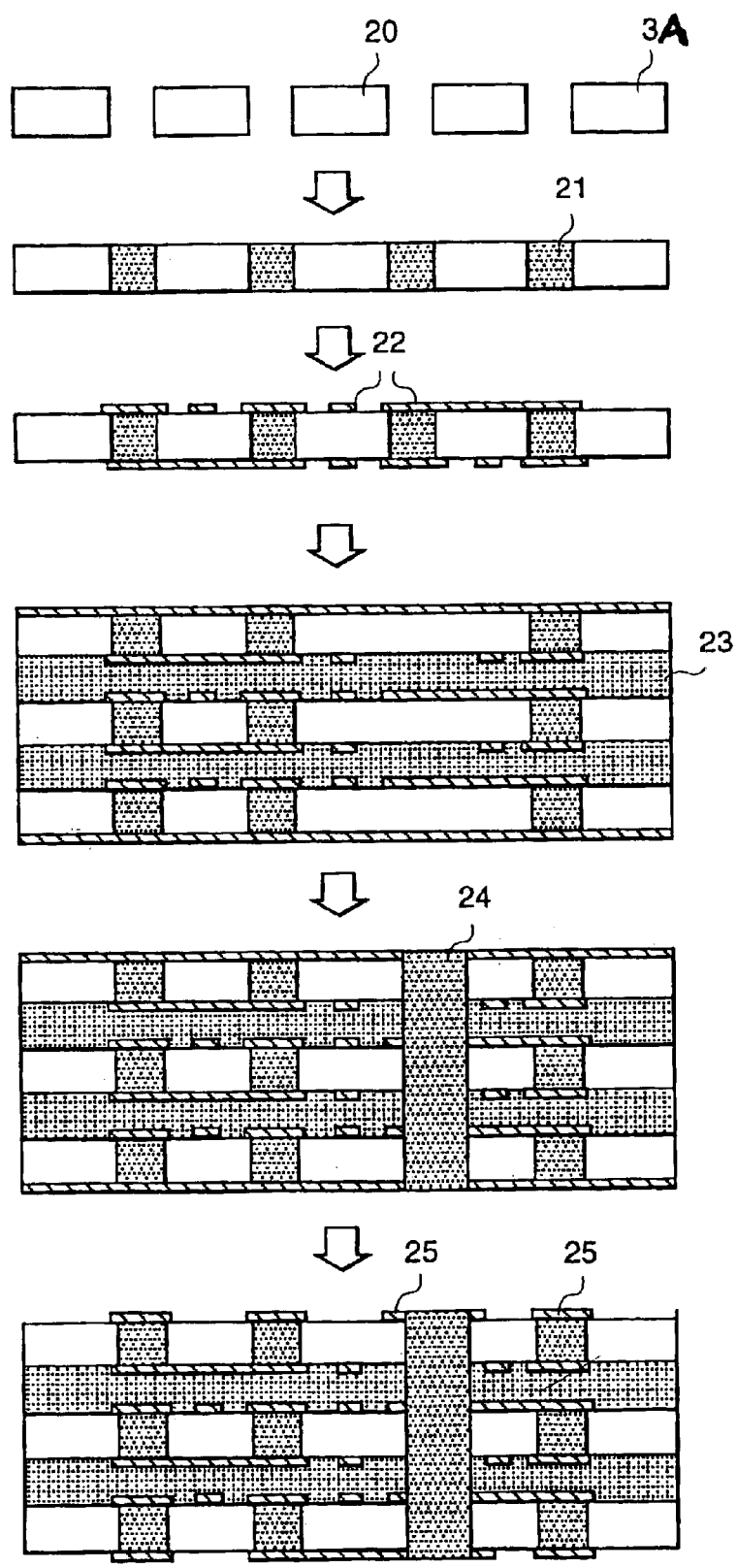
FIG. 4 is a process flow diagram showing a process of producing a multi-layer printed wiring board.

The process for producing a printed wiring board will be explained hereunder with reference to FIG. 4.

After the paste conductive bonding material 21 is put into through holes 20 that are 0.2 mm in diameter, arranged on a glass epoxy laminated plate (FR-5 equivalent) 3A in a size of 300 mm square and a thickness of 0.2 mm, by printing, it is heated to cure it at 170° C. for 60 minutes. After the surface is finished smooth by buffing, a conductive layer having a thickness of 18 μm is formed on each side by electrolytic plating and electroless plating. Then, wiring patterns 22 are formed by etching so as to obtain a double-sided printed wiring board.

Three double-sided printed wiring boards, produced in the same way as described above (the very outer layer is left as bare copper surface), are bonded together using multi-layer bonding prepreg (glass epoxy) 23 having a thickness of 0.1 mm, while being heated at 170° C. for 90 minutes and compressed under 30 kg/cm², so as to produce a multi-layer board having six wiring layers. A through hole 24 of 0.3 mm in diameter is drilled and the paste conductive bonding material 21 is put into the hole in a similar way by printing, and then the board is heated to cure it at 170° C. for 60 minutes. Then, after the surface is finished smooth by buffing, the wiring 25 on the very outer layer is formed by etching so as to obtain a six-layer printed wiring board.

A temperature cycle test of the multi-layer printed wiring board, one cycle being –50° C. for 10 minutes and 150° C. for 10 minutes, was conducted and internal cracking in the conductive bonding material and peeling were checked at every 50 cycles, using an ultrasonic flaw detector, for each 50 via holes and through holes, but no internal cracking appeared in the bonding material even after 2000 cycles or more. The result shows that the reliability through the temperature cycle test is very high.

[Comparison Sample 10]

A multi-layer printed wiring board having six layers is produced in the same way as in the embodiment 15, except that 25 parts by weight of the thermosetting resin composition of the comparison sample 2, that uses the same epoxy resin and curing agent as the above embodiment 15, is employed. However, since the viscosity of the thermosetting resin composition is as high as 14 Pa.s at room temperature (25° C.), it is heated to 50° C. when kneaded. In addition, the paste bonding material is also heated to 50° C. or more when applied by screen-printing.

The paste bonding material was applied by screen-printing and heated at 170° C. for 60 minutes, and then the specific resistance was measured. The result was $3 \times 10^{-5}$ Ω/cm.

A temperature cycle test of the multi-layer printed wiring board, one cycle being –50° C. for 10 minutes and 150° C. for 10 minutes, was conducted and internal cracking in the conductive bonding material and peeling were checked at every 50 cycles, using an ultrasonic flaw detector, for each 50 via holes and through holes. The result showed that cracking was caused in the conductive bonding material on 70% of the through holes after 500 cycles and that cracking appeared in the conductive bonding material on all 50 through holes after 1000 cycles.

The embodiment 15 and comparison sample 10 show that the paste conductive bonding material of the present invention has a low viscosity, allows excellent workability at room temperature, and at the same time, exhibits excellent material properties, including excellent reliability of the cured resin. This is because the paste has a low viscosity and so flows into the through holes evenly and free of voids, and also because the high-temperature material properties of the cures resin are superior. Thus, the present invention can provide a multi-layer printed board with highly reliable connection of the through holes.

(Industrial Field of Application)

Since the thermosetting resin material according to the present invention is in a liquid form and has a low viscosity at room temperature (25° C.), it can be used as a material for casting that can be poured into a molding frame as it is and heated to cure it. In addition, since the resin composition can be filled with a lot of inorganic filler, such as silica and alumina, organic filler, such as a polyamide fiber, or silver power and copper power easily, higher performance of the resin material can be realized easily. Furthermore, since the resin composition does not require use of a reactive diluent, alicyclic type liquid resin or liquid acid-anhydride together to lower the viscosity, it has solved a problem of lowered heat resistance of a cured resin, which is one of the problems concerning the restrictions of use involved with the prior art. Besides, in the cured resin, the oligomer of organosilicon compound based on a heat resistive skeleton is distributed uniformly and, at the same time, reacts with each other with the aid of a curing agent commonly used for the epoxy resin. Because of this, the resin composition is effective in obtaining A better heat-resistive characteristic than that of a cured resin that is obtained by curing the epoxy resin, forming a matrix, through the aid of a curing agent. In other words, the thermosetting resin composition of the present invention, before being cured, has a far lower viscosity at room temperature (25° C.) than the epoxy resin that is used as the component of the resin composition, and the cured resin exhibits excellent high-temperature material properties.

Besides, there remains no problem of voids or cracking caused on the cured resin, because alcohol or water generated as a byproduct have already been removed in the heating process for forming the oligomer of organosilicon compound. For this reason, when a liquid sealing material or die bonding material mixed with inorganic filler, such as silica and alumina, or a conductive paste material mixed with metallic powder, is applied to a semiconductor device or printed wiring board, the material not only provides excellent workability in the production process, but also forms a uniform and void-free resin with excellent high-temperature material properties after being cured. Thus, a semiconductor device or printed wiring board having extremely high reliability can be provided.

What is claimed is:

1. A solvent-free thermosetting resin composition which comprises an epoxy resin (a) and a product (b) of the reaction of an organosilicon compound, represented by the general formula (1)

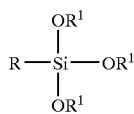

(where R is an organic group containing a functional group reactive with an epoxy resin by addition reaction; and R1 is a methyl or ethyl group), with water, the product (b) containing organosilicon compound polycondensates formed in the presence of the epoxy resin (a) and having a degree of polycondensation of 2 or higher; and which is in a liquid form at a room temperature (25° C.).

2. The solvent-free thermosetting resin composition according to claim 1, wherein said product (b) has been formed in the presence of the epoxy resin, and ratio byproducts including water and alcohol removed therefrom, prior to addition to the epoxy resin (a) and the product (b) of a curing agent of the epoxy resin.

3. The solvent-free thermosetting resin composition according to claim 1, wherein said product (b) is a reactive diluent in the composition, and is compatible with the epoxy resin (a).

4. A solvent-free thermosetting resin composition which comprises an epoxy resin (a), a product (b) of the reaction of an organosilicon compound, represented by the general formula (1)

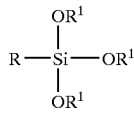

(where R is an organic group containing a functional group reactive with an epoxy resin by addition reaction; and R1 is a methyl or ethyl group), with water, the product (b) containing organosilicon compound polycondensates formed in the presence of the epoxy resin (a) and having a degree of polycondensation of 2 or higher, and a curing agent (c) as essential components; and which is in a liquid form at a room temperature (25° C.).

5. The solvent-free thermosetting resin composition according to claim 4, wherein said product (b) is a reactive diluent in the composition, and is compatible with the epoxy resin (a).

6. The solvent-free thermosetting resin composition according to claim 4, wherein said product (b) has been formed in the presence of the epoxy resin, and reaction byproducts including water and alcohol removed therefrom, prior to addition of said curing agent(c).

7. A process for producing a solvent-free thermosetting resin composition which is in a liquid form at a room temperature (25° C.), where, under an existence of an epoxy resin, an organosilicon compound represented by the general formula (1)

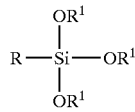

(where R is an organic group containing a functional group reactive with an epoxy resin by addition reaction; and R1 is a methyl or ethyl group) and water are reacted with each other by heating at 60 to 160° C. for 1 to 10 hours and then a curing agent (c) is added.

8. A printed wiring board which, at least, has two or more wiring layers and which layers are made conductive to each other using a conductive material containing a thermosetting resin material, where the conductive material comprises a solvent-free thermosetting resin composition, which comprises an epoxy resin (a), a product (b) of a reaction of an organosilicon compound, represented by the general formula (1)

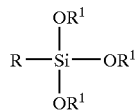

(where R is an organic group containing a functional group reactive with an epoxy resin by addition reaction; and R1 is a methyl or ethyl group), with water in the presence of the epoxy resin (a), and a curing agent (c) as essential components and is in a liquid form at a room temperature (25° C.), and conductive metallic powder as essential components.

* * * * *